United States Patent

Chiang et al.

[11] Patent Number: 5,038,184
[45] Date of Patent: Aug. 6, 1991

[54] THIN FILM VARACTORS

[75] Inventors: Anne Chiang, Cupertino; Scott A. Elrod; Babur Hadimioglu, both of Palo Alto; Tiao-Yuan Huang, Cupertino; Takamasa J. Oki; I-Wei Wu, both of Los Altos, all of Calif.

[73] Assignee: Xerox Corporation, Stamford, Conn.

[21] Appl. No.: 443,993

[22] Filed: Nov. 30, 1989

[51] Int. Cl.⁵ ............... H01L 29/92; H01L 27/12; H01L 27/01; H01L 29/04
[52] U.S. Cl. .................................. 357/14; 357/4; 357/23.7; 357/59
[58] Field of Search ............ 357/23.7, 4, 13, 14, 357/59

[56] References Cited

U.S. PATENT DOCUMENTS

| | | | |
|---|---|---|---|
| 3,872,359 | 3/1975 | Feversauger | 357/4 |
| 4,065,781 | 12/1977 | Gutknecht | 357/23 |
| 4,598,305 | 7/1986 | Chiang et al. | 357/23.7 |
| 4,782,350 | 11/1988 | Smith et al. | 346/140 R |
| 4,876,582 | 10/1989 | Janning | 357/23.5 |
| 4,886,977 | 12/1989 | Gofuku et al. | 250/578 |
| 4,907,041 | 3/1990 | Huang | 357/4 |
| 4,916,504 | 4/1990 | Nakahara | 357/42 |

FOREIGN PATENT DOCUMENTS 2503864  8/1976  Fed. Rep. of Germany ..... 357/23.7

Primary Examiner—Andrew J. James
Assistant Examiner—Cynthia S. Deal

[57] ABSTRACT

This disclosure relates to semiconductor varactors, such as thin film poly-Si varactors, which have larger effective gate areas in accumulation than in depletion, together with capacitive switching ratios which are essentially determined by the ratio of their effective gate area in accumulation to their effective gate area in depletion. To that end, such a varactor has a fully depletable active semiconductor layer, such as a thin poly-Si film, and is constructed so that at least a part of its active layer is sandwiched between a relatively thin dielectric layer and a relatively thick dielectric layer. The thin dielectric layer, in turn, is sandwiched between the active semiconductor layer and a gate electrode. Furthermore, one or more ground electrodes are electrically coupled to laterally offset portions of the active semiconductor layer in partial overlapping alignment with the gate electrode. In keeping with this invention, the capacitance per unit surface area of the thin dielectric layer is so much greater than the capacitance per unit surface area of the thick dielectric layer that the series capacitance of the depleted active semiconductor layer and the thick dielectric layer negligibly contribute to the capacitance of the varactor when it is operating in its depletion mode. Top-gate and bottom-gate embodiments having ground electrodes which are coplanar with the active semiconductor layer, ground electrodes which are in a plane adjacent to the active semiconductor layer, segmented gate electrodes and segmented ground electrodes, and continuous gate electrodes and segmented ground electrodes are disclosed.

17 Claims, 9 Drawing Sheets

THIN FILM VARACTORS

FIELD OF THE INVENTION

This invention relates to improved voltage controlled capacitors ("varactors") which are suitable for large area integrated circuit applications, including rf applications. More particularly, it relates to thin film polysilicon ("poly-Si") varactors which have relatively faithful rf frequency responses and which can be operated at relatively high switching speeds to provide relatively high capacitive switching ratios. Even more specifically, this inventions pertains to large area integrated varactor arrays which are well suited for use as integrated rf amplitude modulators for various applications, such as for amplitude modulating the rf excitation of the individual droplet ejectors of a multi-ejector acoustic ink printer.

BACKGROUND OF THE INVENTION

Large area integrated rf amplitude modulators comprising series and shunt connected varactors have been proposed previously. See a commonly assigned United States patent of Smith et al., which issued Nov. 1, 1988 as U.S. Pat. No. 4,782,350 on "Amorphous Silicon Varactors as RF Amplitude Modulators and Their Application to Acoustic Ink Printing." That patent hereby is incorporated by reference, especially for its description of acoustic ink printing and its description of several of the different configurations in which such varactors may be employed to function as rf amplitude modulators for acoustic ink printheads.

However, there still is a need for large area integrated varactors which have relatively faithful rf frequency responses and which can be relatively rapidly switched back and forth between their maximum and minimum capacitance levels, $C_{max.}$ and $C_{min.}$, respectively to provide increased capacitive switching ratios, R, where:

$$R = C_{max.}/C_{min.} \qquad (1)$$

For example, for acoustic ink printing and the like, it would be desirable to have large area integrated varactors having capacitive switching ratios, R, of approximately two (2) or more for amplitude modulating rf voltages. Taking this example a step further, the rf voltages used for acoustic ink printing typically have peak voltage levels of roughly 60 volts or so and frequencies on the order of about 100–200 MHz. Moreover, printing conventionally is performed by amplitude modulating such voltages at data rates on the order of about 10 Khz in accordance with input data sample pulses having duty ratios of up to approximately 10% or so.

SUMMARY OF THE INVENTION

In response to the foregoing and related needs, this invention provides semiconductor varactors, such as thin film poly-Si varactors, which have larger effective gate areas in accumulation than in depletion, together with capacitive switching ratios which are essentially determined by the ratio of their effective gate area in accumulation to their effective gate area in depletion. To that end, such a varactor has a fully depletable active semiconductor layer, such as a thin poly-Si film, and is constructed so that at least a part of its active layer is sandwiched between a relatively thin dielectric layer and a relatively thick dielectric layer. The thin dielectric layer, in turn, is sandwiched between the active semiconductor layer and a gate electrode. Furthermore, one or more ground electrodes are electrically coupled to laterally offset portions of the active semiconductor layer in partial overlapping alignment with the gate electrode. In keeping with this invention, the capacitance per unit surface area of the thin dielectric layer is so much greater than the capacitance per unit surface area of the thick dielectric layer that the series capacitance of the depleted active semiconductor layer and the thick dielectric layer negligibly contribute to the capacitance of the varactor when it is operating in its depletion mode. Top-gate and bottom-gate embodiments having ground electrodes which are coplanar with the active semiconductor layer, ground electrodes which are in a plane adjacent to the active semiconductor layer, segmented gate electrodes and segmented ground electrodes, and continuous gate electrodes and segmented ground electrodes are disclosed.

BRIEF DESCRIPTION OF THE DRAWINGS

Further objects and advantages of this invention will become apparent when the following detailed description is read in conjunction with the attached drawings, in which.

DETAILED DESCRIPTION OF THE PREFERRED EMBODIMENTS

While the invention is described in some detail hereinbelow with specific reference to certain illustrated embodiments, it is to be understood that there is no intent to limit it to those embodiments. On the contrary, the intent is to cover all modifications, alternatives and equivalents following within the spirit and scope of the invention as defined by the appended claims.

Figure 1:
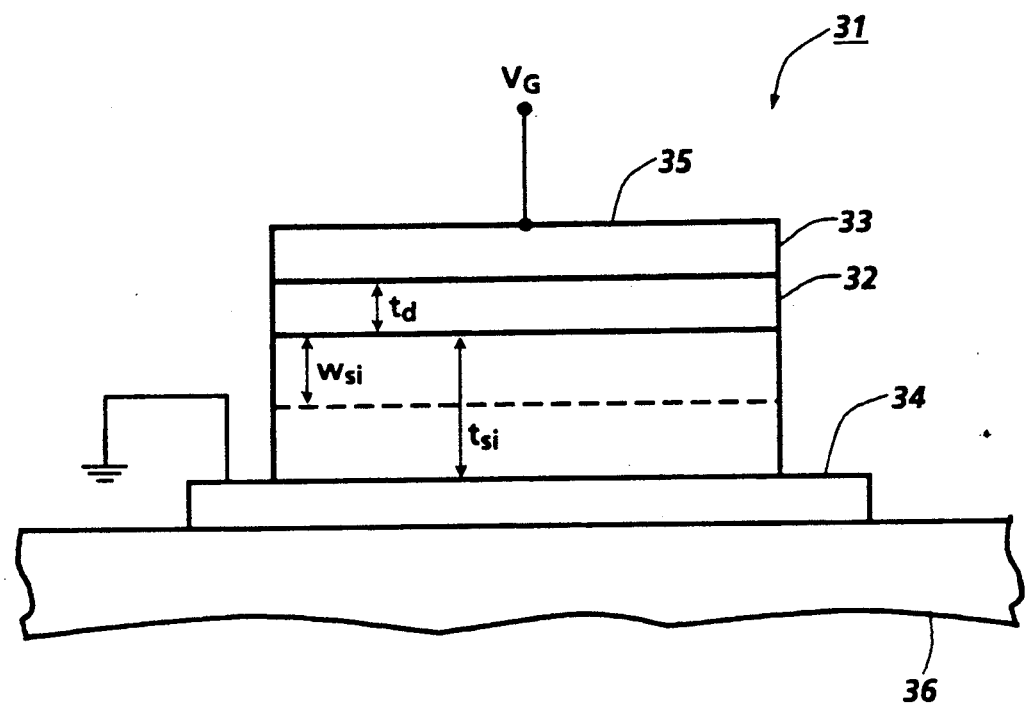
FIG. 1 is a fragmentary elevational view of a known vertical varactor.

Turning now to the drawings, and at this point especially to FIG. 1 for a brief review of a typical prior art top-gate varactor 31, it will be seen this known varactor comprises an active semiconductor layer 32 (this is referred to as an "active" layer herein because it is subject to being switched back and forth between accumulation and depletion) which is sandwiched between a dielectric film 33 and a ground electrode 34 (i.e., an electrode which is returned to a predetermined reference potential, referred to herein as "ground"). Furthermore, a gate electrode 35 is deposited on top of the dielectric film 33. In operation, the varactor 31 is switched back and forth between its maximum capacitance accumulation mode and its minimum capacitance depletion mode by reversing the polarity of its gate voltage, Vg. Typically, the varactor 31 is supported on an insulating substrate 36.

For purposes of describing the operation of the varactors disclosed herein, it will be assumed that their ground electrodes are composed of n-type silicon, so that their operation can be described from the viewpoint of the electron current flow that takes place. Nevertheless, it is to be understood that the same general principles apply to equivalent devices which have hole current flows.

With that in mind, it will be understood that whenever the gate 35 of the varactor 31 is positively biased, electrons are accumulated in the silicon layer 32 near its interface with the dielectric film 33. As a general rule, the positive bias that is applied is sufficient to cause the varactor 31 to saturate, so its maximum capacitance is given by:

$$C_{max.} = C_d = A\epsilon_0\epsilon_d/t_d \quad (2)$$

where:
$C_d$ = the capacitance of the dielectric film 33;
A = the surface area of the active silicon layer 32;
$\epsilon_0$ = the electrical permittivity in a vacuum ($8.85 \times 10^{-14}$ F/cm);
$\epsilon_d$ = the dielectric constant of the dielectric film 33; and
$t_d$ = the thickness of the dielectric film 33

Conversely, when the gate 35 is sufficiently negatively biased to cause saturation of the varactor 31, the silicon layer 32 is depleted of electrons to a depth, $W_{Si}$, (the bias is pulsed to prevent the device from going into inversion), so the minimum capacitance of the varactor 31 is given by:

$$C_{min.} = \frac{C_d C_{Si}}{C_d + C_{Si}} \quad (3)$$

with the capacitance, $C_{Si}$, of the depleted silicon layer 32 being given by:

$$C_{Si} = A\epsilon_0\epsilon_{Si}/W_{Si} \quad (4)$$

where: $\epsilon_{Si}$ = the dielectric constant of the silicon layer 32.

Thus, by combining equations (2) and (3), the capacitive switching ratio, R, of the varactor 31 can be expressed in terms of the capacitances, $C_{Si}$ and $C_d$, of the silicon layer 32 and the dielectric layer 33, respectively, as:

$$R = \frac{C_d + C_{Si}}{C_{Si}} \quad (5)$$

Moreover, by using equations (2) and (4) to expand equation (5), it can be shown that the capacitive switching ratio, R, of the varactor 31 varies in direct dependence upon the depth, $W_{Si}$, to which its active silicon layer 32 is depleted when the varactor 31 is operated in a saturated depletion mode, because:

$$R = kW_{Si} + 1 \quad (6)$$

where: $k = \epsilon_d/\epsilon_{Si}t_d$ (a constant).

If the active silicon layer 32 is single crystal silicon, the depth, $W_{Si}$, to which it can be depleted by a given bias voltage of practical magnitude is governed primarily by the doping concentration of the single crystal silicon and can be very large, so capacitive switching ratios, R, well in excess of two (2) can be achieved relatively easily. Furthermore, the series resistance to ground of undepleted single crystal silicon can be made low, so varactors of that type are suitable for amplitude modulating rf voltages at substantial data rates. Unfortunately, however, the existing single crystal silicon technology is not applicable to the fabrication of large area integrated circuits.

Amorphous silicon ("a-Si") films have been developed for the fabrication of large area integrated circuits, but it is difficult to obtain a sufficiently high capacitive switching ratio, R, for the varactor 31 if its active semiconductor layer 32 is composed of a-Si. One of the more troublesome problems is that the depth, $W_{Si}$, to which such a material can be depleted tends to be severly limited by the usual defect density of the a-Si. Moreover, for applications calling for a low resistance to ground, the aforementioned problem is compounded because a low resistance to ground is provided by such a varactor only when the a-Si film 32 is depleted to a depth, $W_{Si}$, which is equal to or greater than its thickness, $t_{Si}$ (undepleted a-Si typically presents a substantial resistance because of its large band gap, its low mobility, and its high defect density). As will be appreciated, poly-Si films are a viable alternative to a-Si films for relatively high frequency modulation of rf voltages because they can be depleted to a substantially greater depth and will provide a lower series resistance to ground than conventional a-Si films, so reference is made to the above-identified U.S. Pat. No. 4,782,350 to indicate the equivalency of such poly-Si films as applied to the varactor 31. Moreover, that patent also illustrates the bottom-gate counterpart to the varactor 31, so it will supplement the foregoing discussion of the prior art.

Figure 2:
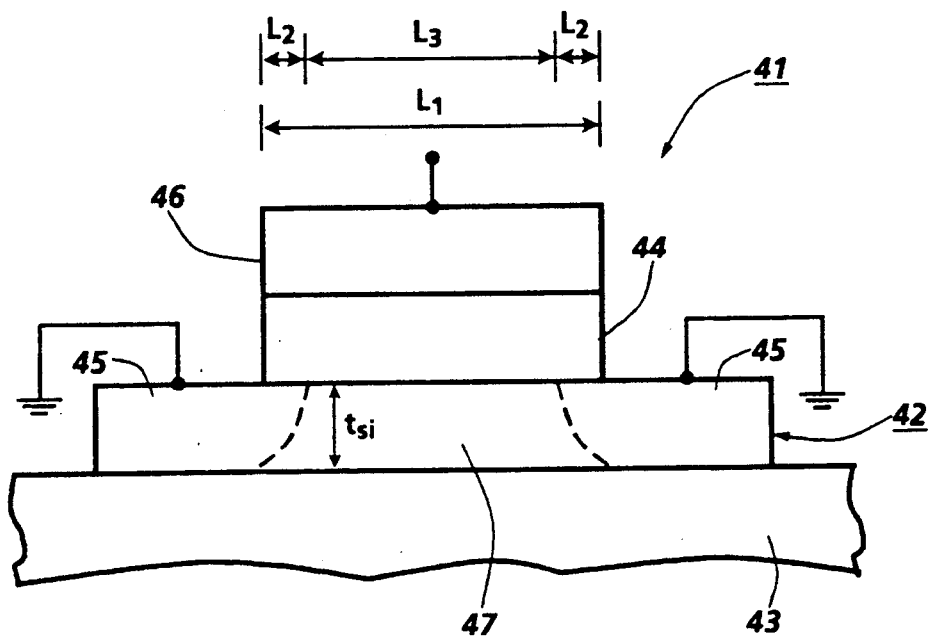
FIG. 2 is a fragmentary elevational view of a relatively simple top-gate varactor constructed in accordance with the present invention.

Referring to FIG. 2, the present invention contemplates varactors, such as the varactor 41, which have smaller effective capacitive surface areas in depletion than in accumulation. Poly-Si thin films are preferred for these varactors, but it will be apparent that the broader features of the invention may be used to advantage in varactors composed of other semiconductor materials.

More particularly, as shown in FIG. 2, the varactor 41 typically is fabricated by first depositing a thin film 42 of undoped or very lightly doped silicon (e.g., poly-Si) on a much thicker, insulating substrate 43. Various thin film deposition processes are available for carrying out this step; including chemical vapor deposition (CVD), plasma enhanced chemical vapor deposition (PECVD), sputtering, evaporation and several more specialized silicon-on-insulator (SOI) deposition techniques. Moreover, many different annealing techniques are known for achieving the desired degree of crystallinity in the thin film. Following the deposition of the silicon film 42, a thin dielectric film 44 is formed on it, either by depositing a suitable dielectric on the silicon film 42 or by causing the silicon film 42 to react, for example, in an oxidizing or nitriding environment. Thereafter, a metallized or silicon gate electrode 46 is deposited on the dielectric film 44. If the gate electrode 46 is silicon, the silicon is degenerately doped p+ or n+, either while it is being deposited or subsequently by means of an ion-implantation or diffusion process, with or without masking. As shown in FIG. 2, the dielectric film 44 and the gate electrode 46 are patterned so that they essentially conform to each other and terminate inwardly from the outer extremities of the silicon film 42, thereby permitting ground electrodes 45 to be formed in coplanar relationship with respect to the active silicon film 42 by degenerately doping the outer extremities of the silicon film 42 with n-type or p-type impurities, as more fully described herein below.

In accordance with the present invention, the ground electrodes 45 of the varactor 41 are configured so that they only partially laterally overlap its gate electrode 46. As a result, the gate electrode 46 longitudinally aligns with a section 47 of the active silicon layer 42 which is beyond the lateral margins of the ground electrodes 45 but in intimate electrical contact with the substrate 43. Self aligned ion-implantation or diffusion of n-type or p-type impurities can be used to form the ground electrodes 45 after the deposition and patterning of the dielectric film 44 and the gate electrode 46, such that the extent to which the ground electrodes 45 laterally overlap the gate electrode 46 is determined by the lateral scattering of the impurities as they migrate into the silicon film 42. Or, a somewhat higher energy level self-aligned ion implantation process can be employed for forming the ground electrodes 45 after the gate electrode 46 is patterned, but without any patterning of the dielectric film 44, inasmuch as the alignment of the ground electrodes 45 is essentially fully defined by the patterning of the gate electrode 46. Alternatively, of course, a photolithographically defined mask and conventional photoresist masking process can be employed for forming the ground electrodes 45 prior to depositing the dielectric film 44 and gate electrode 46. Regardless of the process that is employed to form them, the ground electrodes 45 are degenerately doped to have n+ or p+ conductivities.

Standard "back end processing" is performed to complete the fabrication of the varactor 41, as well as all of the other varactors described herein. During the course of this back end processing, a dielectric isolation layer (not shown) is deposited on top of the varactor 41, then vias (not shown) are opened in the isolation layer to allow electrical contacts to be made to the gate and ground electrode, and then a metallic film (see FIG. 8) is deposited and patterned to provide the electrical contacts for the gate and ground electrodes.

In accumulation, the maximum capacitance, $C_{max.}$, of the varactor 41, is determined by the surface area, $A_g$, of its gate electrode, because:

$$C_{max.} = A_g C'_d \tag{7}$$

where: $C'_d$ = the per unit surface area capacitance of the dielectric film 44.

Furthermore, in keeping with this invention, the thickness of the active silicon film 42 is selected so that:

$$t_{Si} < W_{Si} \tag{8}$$

such that the active silicon 42 is fully depletable. Therefore, if the thickness, $t_i$, of the substrate 43 is selected for a given capacitive switching ratio, R, so that:

$$t_i >> R t_d \epsilon_i / \epsilon_d \tag{9}$$

where: $\epsilon_i$ = the dielectric constant of the substrate 43.

The series capacitance of the silicon film 42 and of the insulating substrate 43 contribute negligibly to the minimum capacitance, $C_{min.}$, of the varactor 41 because their series capacitance is in parallel with the much larger capacitance of the dielectric film 44 when the silicon film 42 is fully depleted. This means that the minimum capacitance, $C_{min.}$, of the varactor 41 can be expressed as:

$$C_{min.} = A_0 C'_d \tag{10}$$

where: $A_0$ = the area of the lateral overlap between the gate electrode 46 and the ground electrodes 45, so the switching ratio, R, of the varactor 41 is given by:

$$R = A_g / A_0 \tag{11}$$

In other words, in accordance with this invention, the capacitive switching ratio of the varactor 41 is essentially fully determined by the ratio of its gate area 46 to the area of the portions of the gate electrode 46 which are overlapped by its ground electrodes 45.

Figure 3:
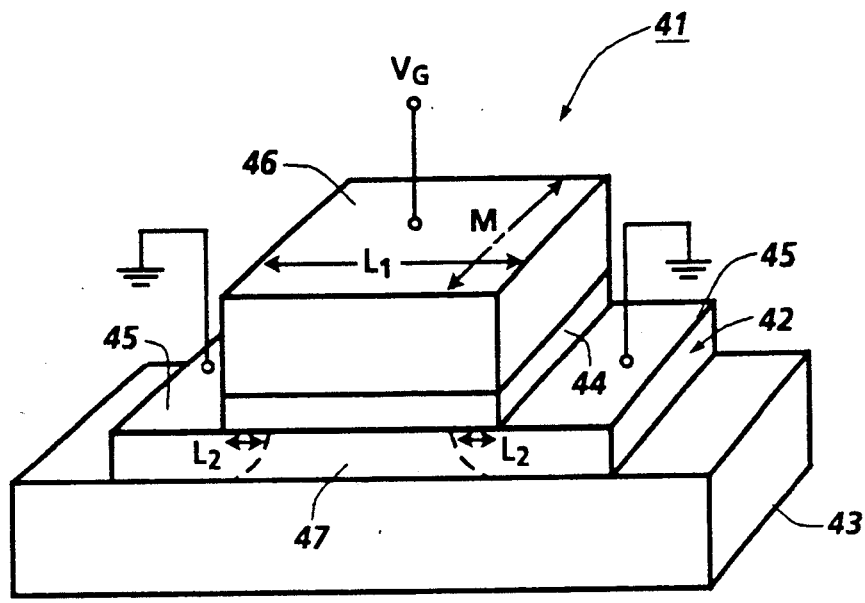
FIG. 3 is an isometric view of the varactor shown in FIG. 2.

Referring to FIG. 3 to supplement FIG. 2, it will be seen that the area of the gate electrode 46 of the varactor 41 is:

$$A_g = L_1 M \tag{12}$$

where:
$L_1$ = the length of the gate electrode 46; and
$M$ = the width of the gate electrode 46.

It also will be observed that the area of the gate electrode 46/ground electrode 45 overlap is:

$$A_0 = 2 L_2 M \tag{13}$$

where: $L_2$ = the length of the lateral overlap between each of the ground electrodes 45 and the gate electrode 46 (while equal overlaps have been assumed for the sake of simplicity, it is to be understood that they need not be equal)

Thus, equations (12) and (13) can be substituted into equation (11) to show that:

$$R = L_1/2L_2 \quad (14)$$

Furthermore, it will be apparent that the channel resistance, $R_{Si}$, of the varactor 41 (i.e., the resistance between its ground electrodes 45) is proportional to its effective gate length, $L_3$, in depletion, where:

$$L_3 = L_1 - 2L_2 \quad (15)$$

Equations (14) and (15) may be especially helpful to designers contemplating different embodiments of this invention because they highlight an important performance tradeoff, whereby the channel resistance, $R_{Si}$, of the varactor 41 can be reduced to obtain faster switching speeds and lower rf impedance at the cost of decreasing its capacitive switching ratio, R, and vice-versa.

Figure 4:
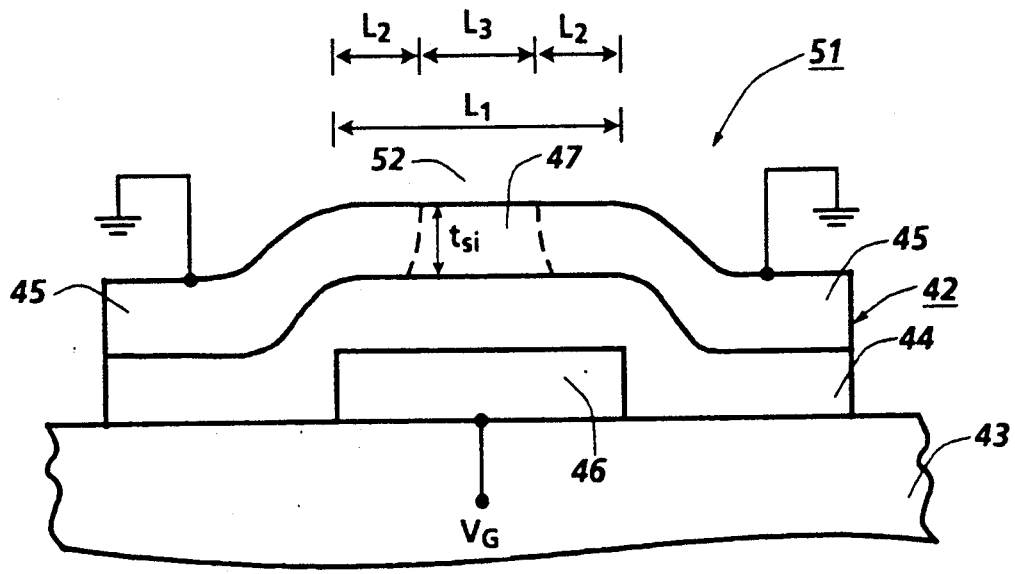
FIG. 4 is a fragmentary elevational view of a bottom-gate counterpart to the varactor shown in FIGS. 2 and 3.

The varactor 51 shown in FIG. 4 is a bottom-gate counterpart to the above-described varactor 41. Like reference numerals have been used to identify like parts in the various embodiments of this invention, so it will be clear that the only significant difference between the varactors 41 and 51 is that the varactor 51 is fabricated by reversing the previously described deposition sequence. As result, the composite of the isolation layer (not shown) and the ambient air 52 is the thick dielectric layer equivalent to the substrate 43 of the varactor 41. The presence of the dielectric isolation layer does not materially alter the operation of the varactor 51 because it simply is one additional series capacitance in the series capacitive path comprising the silicon layer 42 and the ambient air 52 when the silicon layer 42 is fully depleted to operate the varactor 51 in its minimum capacitance, $C_{min.}$, mode.

Figure 5:
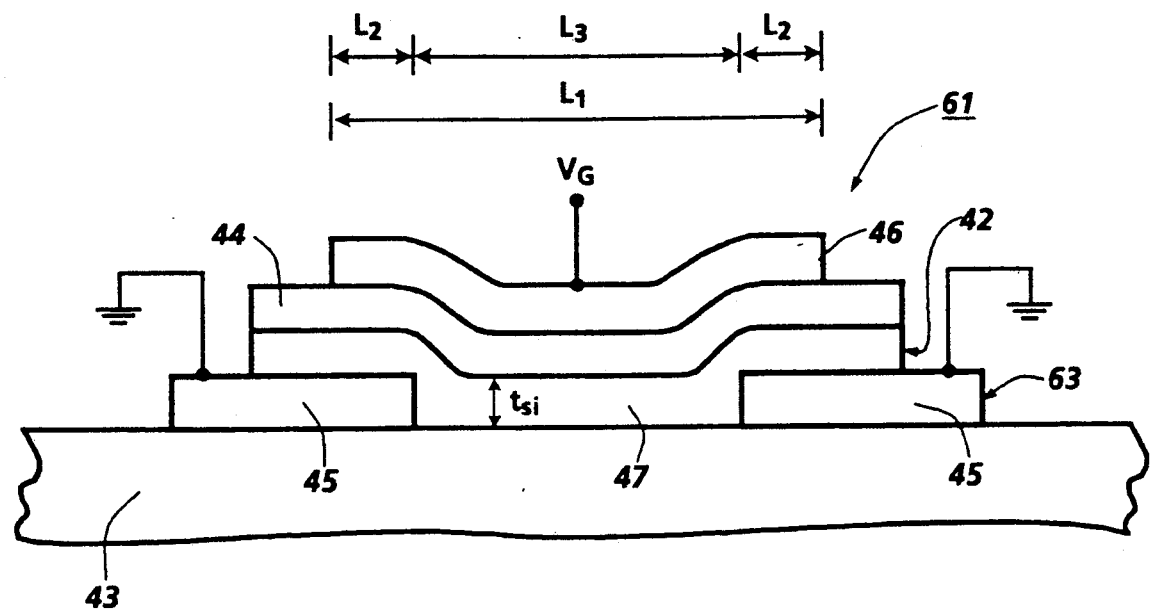
FIG. 5 is a fragmentary elevational view of a top-gate embodiment of the invention with ground electrodes which are physically distinct from the active silicon layer.
Figure 6:
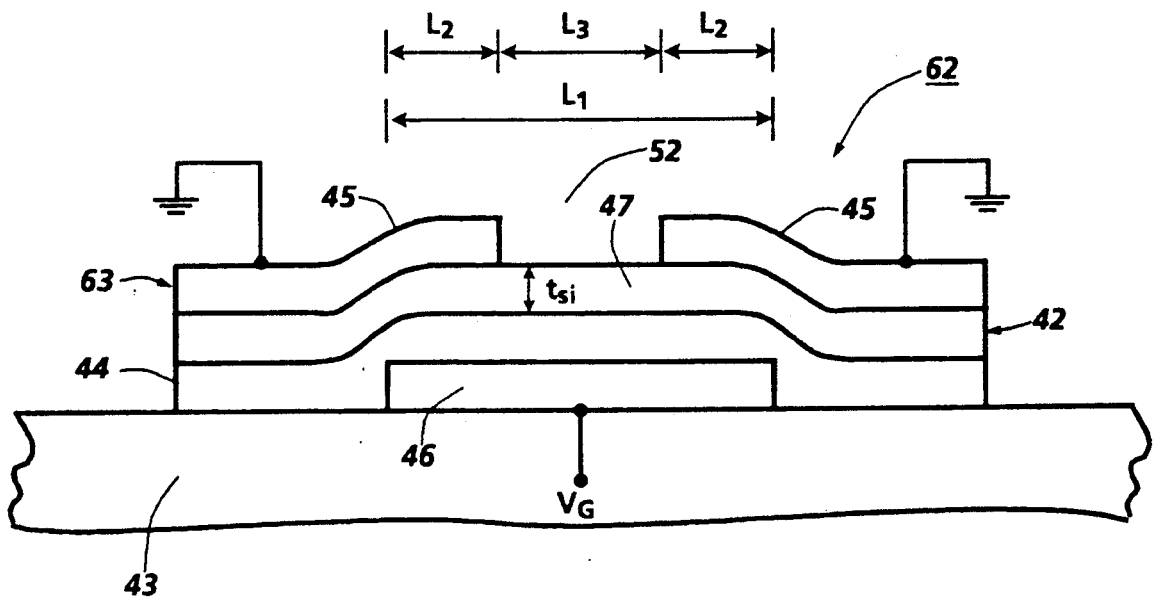
FIG. 6 is a fragmentary elevational view of a bottom-gate counterpart to the varactor shown in FIG. 5.

Referring to FIGS. 5 and 6, it will be observed that top-gate and bottom-gate varactors 61 and 62, respectively, can be constructed in accordance with this invention with their ground electrodes 45 residing in a suitably patterned conductive layer 63 which is physically distinct from the active silicon film 42 but in intimate contact therewith in partially overlapping alignment with the gate electrode 46. Typically, the layer 63 is composed of either metal or degenerately doped n+ or p+ silicon (preferably, poly-Si) which is photolithographically patterned to form the ground electrodes 45. As a general rule, smaller ground/gate overlaps can be obtained by using the above-described self-aligned ion-implantation process for forming the ground electrodes 45 in the silicon layer 42 (overlaps as small as 0.1 $\mu$m-1.0 $\mu$m can be provided by that techinque), but photolithographically patterned ground electrodes 45 are useful for embodiments for which gate/ground overlaps as large as a few microns are acceptable.

Figure 7:
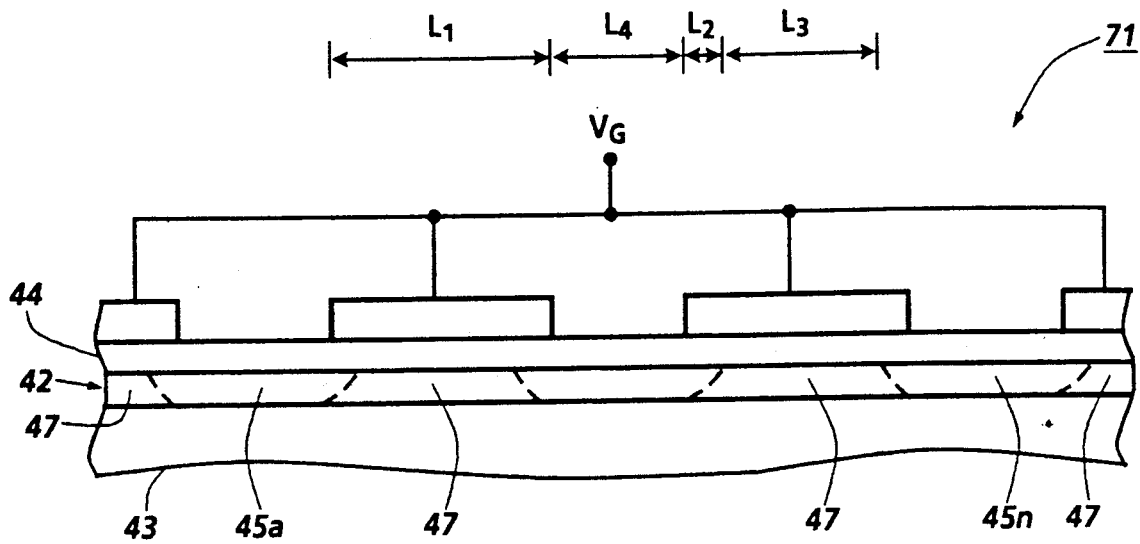
FIG. 7 is a fragmentary elevational view of a top-gate varactor which is constructed in accordance with one of the more detailed features of this invention to have segmented gate and ground electrodes.
Figure 8:
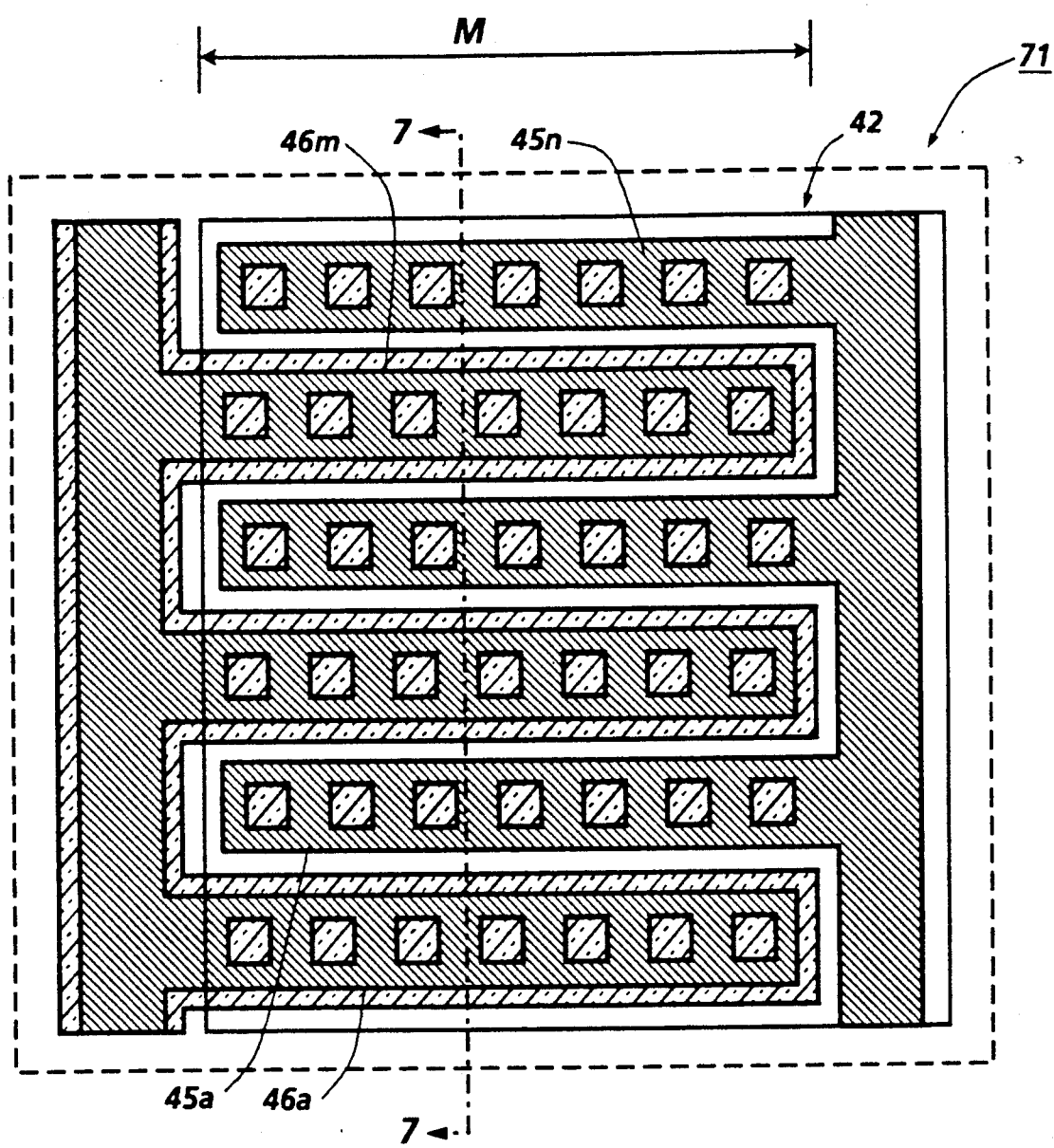
FIG. 8 is a schematic layout diagram of the varactor shown in FIG. 7.

Turning next to FIGS. 7 and 8, in keeping with one of the more detailed features of this invention, there is a top-gate varactor 71 having segmented gate electrodes 46a–46m and segmented ground electrodes 45a–45n which are laterally staggered with respect to the gate electrode segments 46a–46m. More particularly, there are m gate electrode segments 46a–46m and n ground electrode segments 45a–45n, where n=m+1. Each of the gate electrode segments 46a–46m is partially laterally overlapped by two of the ground electrode segments 46a–46n essentially as previously described, but in this embodiment neighboring gate segments share the ground electrode segments that are disposed between them, so each of those intermediate ground electrode segments partially overlaps the gate electrode segments to its immediate right and to its immediate left. Interdigitated metallizations 72 and 73 suitably are provided during the conventional back end processing for electrically interconnecting the gate electrode segments 46a–46m and the ground electrode segments 45a–45n, respectively.

Assuming that the gate/ground overlap, $2L_2$ for each gate segment of this segmented gate/segmented ground embodiment is the same as the gate/ground overlap of the continuous gate electrode/dual ground electrode embodiments described hereinabove, it will be apparent that the segmentation of the gate and ground electrodes 46a–46m and 45a–45n, respectively, increases the total gate width of the varactor 71 by a factor of m while also reducing its effective gate length by the same factor m, thereby reducing the channel resistance, $R_{Si}$, of the varactor 71 by a factor of approximately $m^2$.

Figure 9:
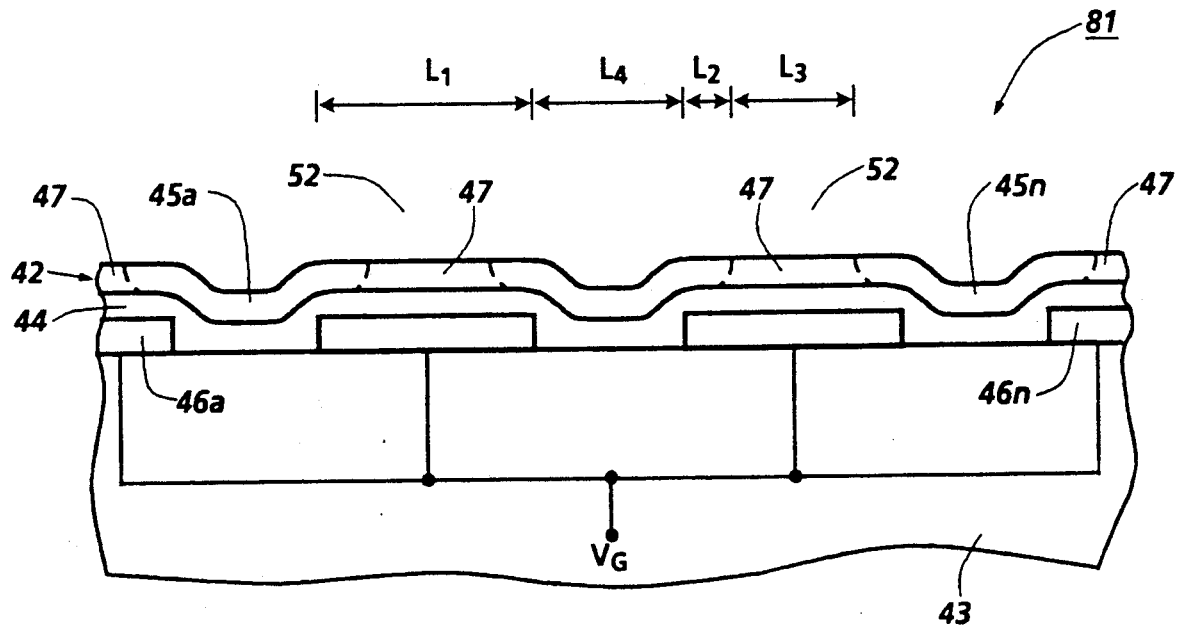
FIG. 9 is a fragmentary elevational view of a bottom-gate counterpart to the varactor shown in FIGS. 7 and 8.
Figure 10:
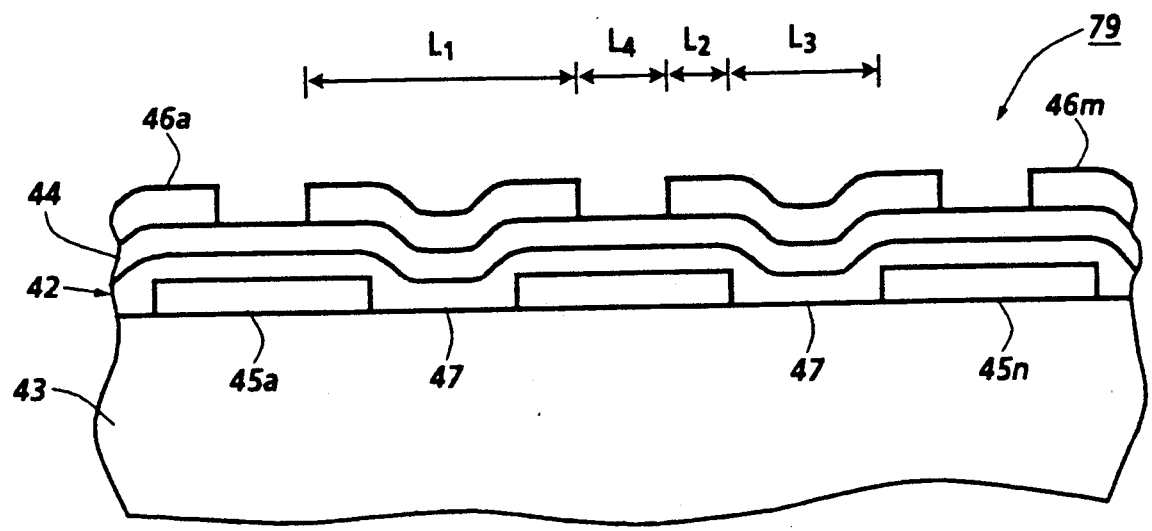
FIG. 10 is a fragmentary elevational view which illustrates an alternative configuration for the ground electrodes of the top-gate varactor shown in FIGS. 7 and 8.
Figure 11:
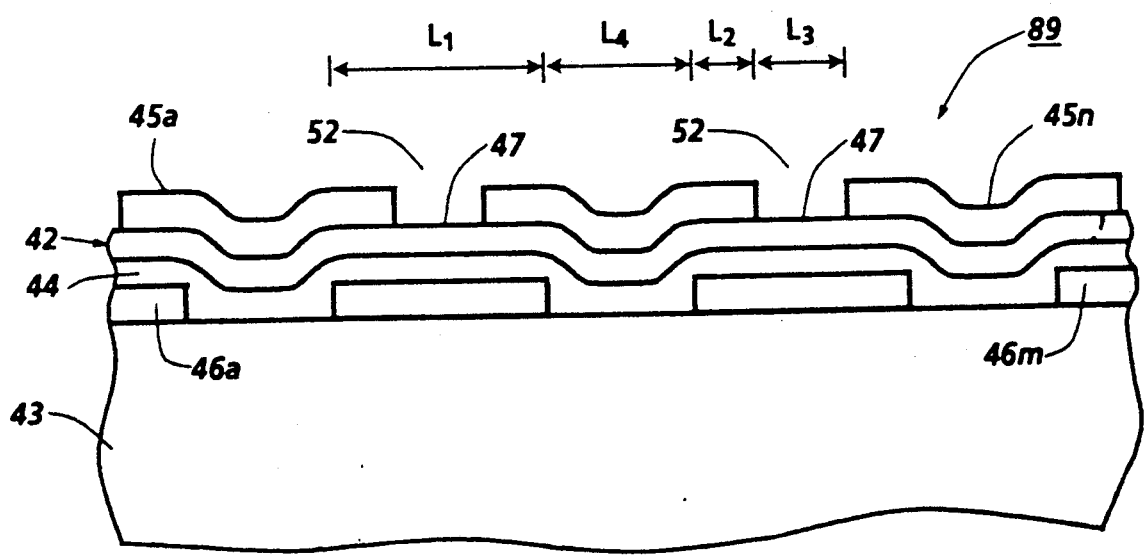
FIG. 11 is a fragmentary elevational view of a bottom-gate counterpart to the varactor shown in FIG. 10.

FIG. 9 illustrates a varactor 81 which is a bottom-gate counterpart to the varactor 71 shown in FIGS. 7 and 8. Likewise, FIGS. 10 and 11 illustrate the physically distinct, patterned ground electrode alternatives 79 and 89 to the top-gate varactor 71 of FIGS. 7 and 8 and to the bottom-gate varactor 81 of FIG. 9, respectively.

Figure 12:
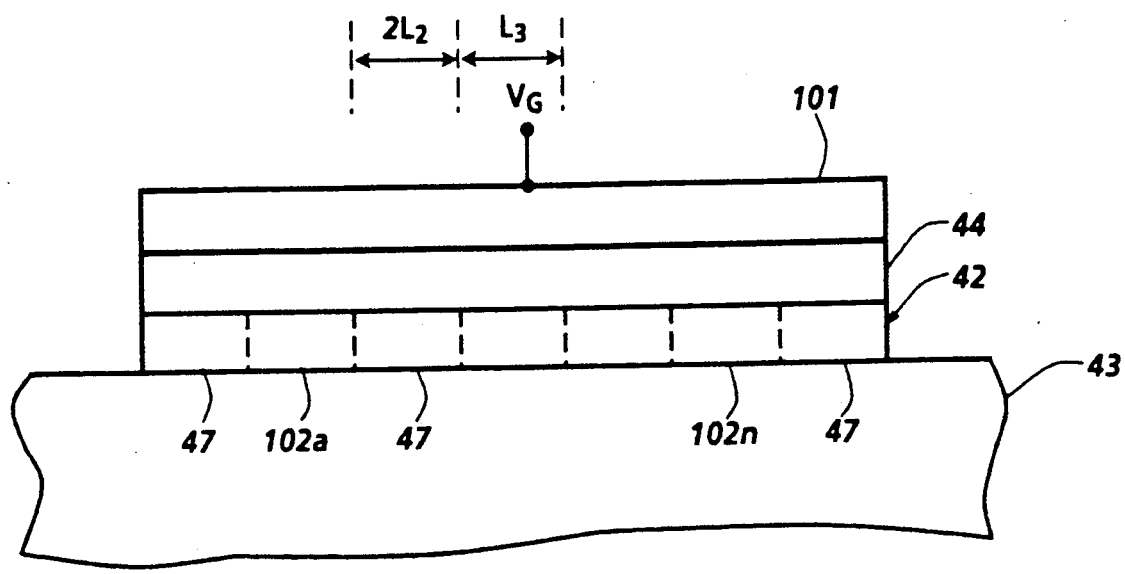
FIG. 12 is a fragmentary elevational view of a continuous top-gate, segmented ground electrode embodiment of this invention.

Turning now to FIG. 12, there is a varactor 100 comprising a continuous gate electrode 101 and segmented ground electrodes 102a–102n. In other words, the intra gate gap, $L_4$ (see FIGS. 7-11) has been reduced to zero. Therefore, the number of ground electrodes 102a–102n per unit area of the varactor 100 is limited only by the resolution of the photolithographic process that is used to form them. The continuous gate electrode 101 minimizes the space required for a gate electrode having the surface area, $A_g$, that is needed to achieve a given maximum capacitance, $C_{max.}$, while the segmentation of the ground electrodes 102a–102n maximizes the ground electrode density which can be achieved, thereby permitting the channel resistance, $R_c$, to be minimized.

Figure 13:
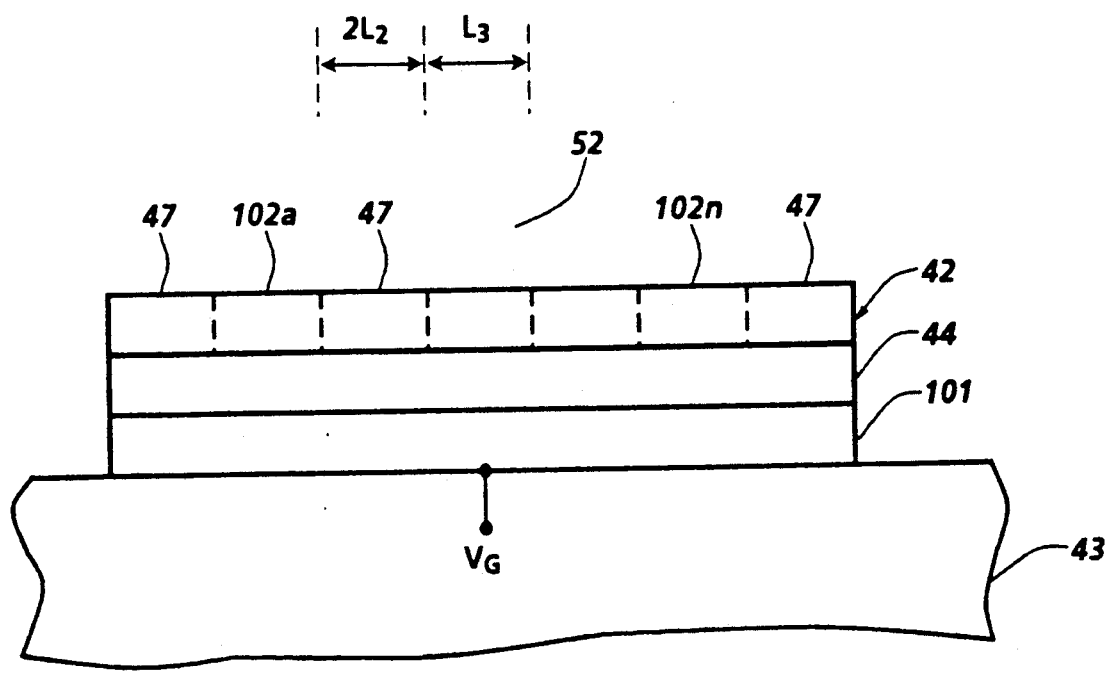
FIG. 13 is a fragmentary elevational view of a bottom-gate counterpart to the varactor shown in FIG. 12.
Figure 14:
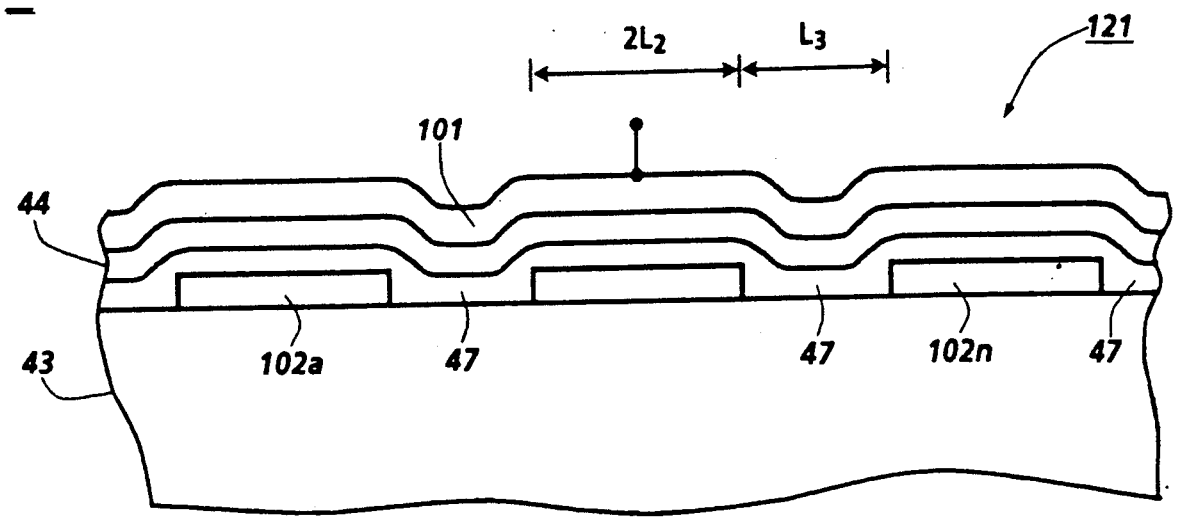
FIG. 14 is a fragmentary elevational view which illustrates an alternative configuration for the ground electrodes of the top-gate varactor shown in FIG. 12.
Figure 15:
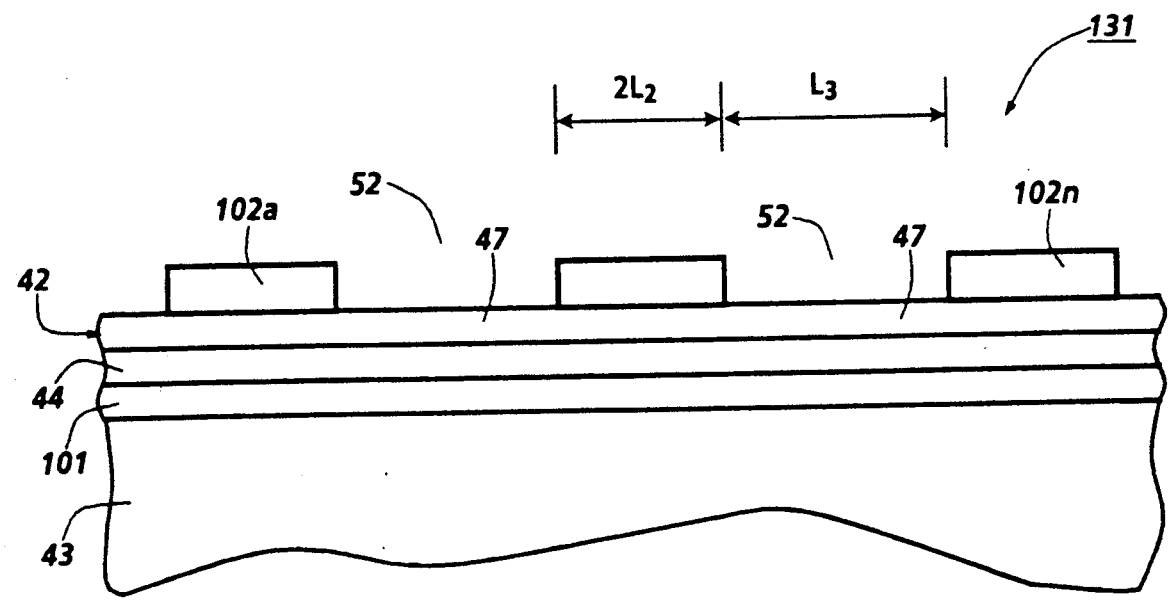
FIG. 15 is a fragmentary elevational view of a bottom-gate counterpart to the varactor shown in FIG. 14.

As will be understood, the varactor 111 shown in FIG. 13 is a bottom-gate counterpart to the varactor 100 of FIG. 12. The physically distinct ground electrode equivalents to the top and bottom-gate varactors 100 and 111 of FIGS. 12 and 13 are shown in FIGS. 14 and 15 at 121 and 131, respectively.

Figure 16:
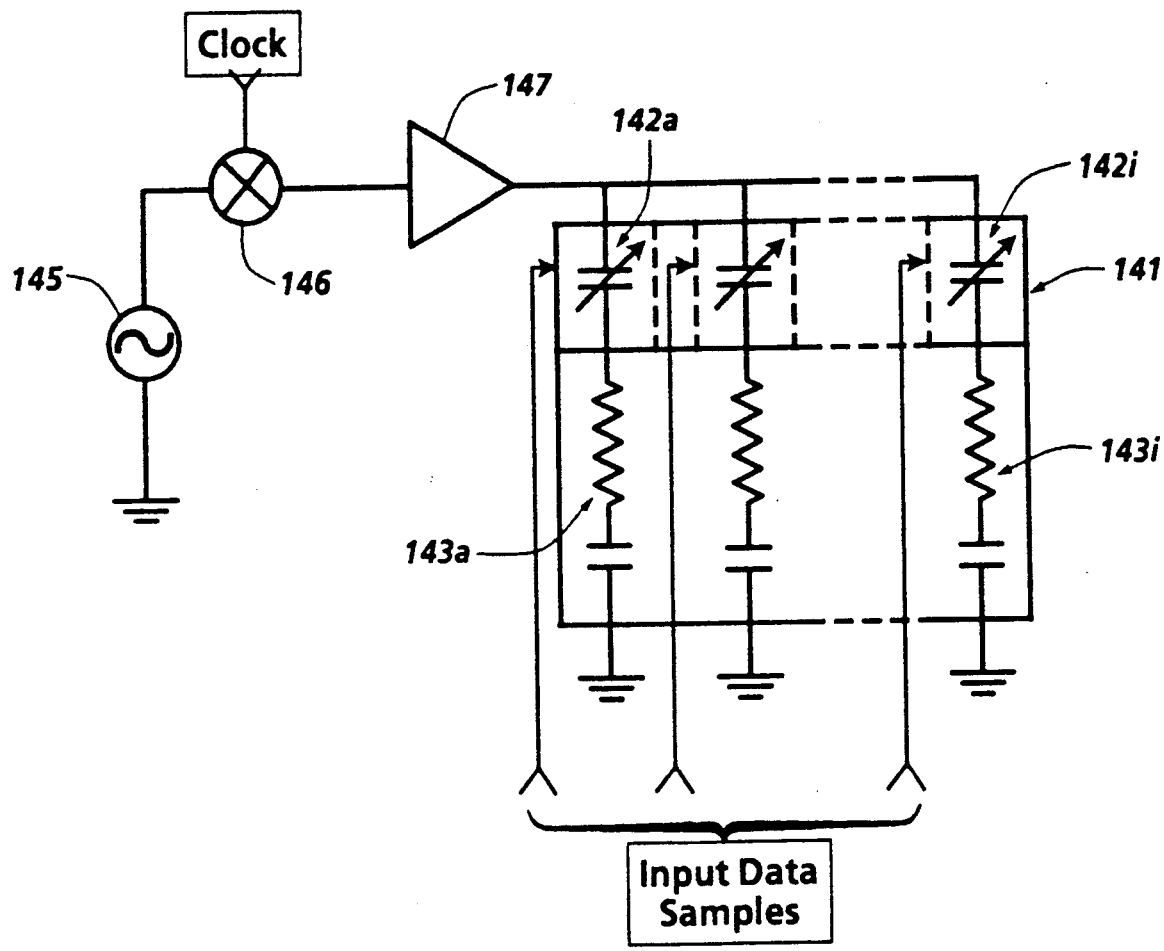
FIG. 16 is a simplified schematic diagram of an array of varactors for amplitude modulating the rf voltages applied to an array of droplet ejectors in an acoustic ink printer.

Turning to FIG. 16, there is an array 141 of varactors 142a–142i which are coupled in series with piezoelectric transducers 143a–143i, respectively, for amplitude modulating the rf voltages that are applied to the transducers 143a–143i in accordance with the input data samples for, say, an acoustic ink printer. As shown, the transducers 143a–143i and their respective series connected varactors 142a–142i are coupled in parallel across an rf oscillator 145 through a clock controlled switch 146 and a power amplifier 147. In operation, the switch 146 pulse modulates the rf to provide rf pulses having a predetermined duty ratio at a predetermined data rate, and the power amplifier 147 amplifies the rf pulses to a suitably high level for acoustic ink printing. The varactors 142a–142i, in turn, amplitude modulate the rf pulses that are applied to the transducers 143a–143i in accordance with the input data samples for the respective droplet ejectors (not shown), thereby selectively turning the droplet ejectors "on" for the printing of, say, "black" pixels (or selected bits of "gray" pixels) and off for the printing of "white" pixels (or the other bits of gray pixels). Any of the above-described varactors may be employed in the array 141.

Moreover, as will be evident from the aforementioned U.S. Pat. No. 4,782,350, the varactors 142a–142i may be employed as amplitude modulators for rf voltages in any one of several different series and/or shunt configurations. Indeed, the array 141 is only one example of an application which is facilitated by the compatibility of the varactors of the present invention with large area fabrication techniques.

CONCLUSION

In view of the foregoing, it will be apparent that the capacitive switching ratios and the channel resistances of the varactors provided by present invention can be tailored to meet the requirements of many different applications, including those which require relatively high capacitive switching ratios and relatively low effective resistances. It also will be evident that well known large area integration techniques, such as large area poly-Si integrated circuit fabrication processes, can be utilized to produce integrated arrays of these varactors. To simplify this disclosure, varactors having generally rectangular geometries have been shown and described, but it will be clear that the principles of the present invention apply equally as well to varactors having other geometries, such as circular, ring-like or virtually any other geometry that a skilled designer may find to be attractive for a particular application.

What is claimed is:

1. A two terminal varactor comprising
   a gate electrode, said gate electrode being connected to a first terminal of said varactor;
   a first dielectric layer;
   a fully depletable active semiconductor layer laterally extending across said gate electrode, with at least one predetermined section of said active layer being in intimate contact with said first dielectric layer and in alignment with said gate electrode;
   a second dielectric layer laterally extending across said gate electrode in intimate contact between said gate electrode and said active layer; said second dielectric layer being substantially thinner than, and having a significantly higher per unit surface area capacitance than, said first dielectric layer; and
   at least one ground electrode electrically coupled to at least one side of said active layer immediately adjacent to said predetermined section and in partial overlapping alignment with said gate electrode; said ground electrode being connected to a second terminal of said varactor;
   whereby said varactor has a larger effective gate area in accumulation than in depletion and has a capacitive switching ratio which is essentially determined by the ratio of its effective gate area in accumulation to its effective gate area in depletion.

2. The varactor of claim 1 wherein
   said semiconductor layer is a thin film semiconductor.

3. The varactor of claim 2
   said semiconductor layer is doped to define each ground electrode.

4. The varactor of claim 2 wherein
   each ground electrode resides in a patterned layer which is longitudinally adjacent to said active layer.

5. The varactor of any of claims 1–4 wherein
   said semiconductor layer is thin film polysilicon.

6. The varactor of any of claims 1–4 wherein
   said varactor has first and second ground electrodes which are electrically coupled to said active semiconductor layer on opposite lateral sides of said predetermined section.

7. The varactor of claim 6 wherein
   said semiconductor layer is thin film polysilicon.

8. The varactor of claim 1 wherein
   said varactor has a plurality of ground electrode segments which are spatially distributed laterally across said gate electrode, such that each of said ground electrode segments at least partially overlaps said gate electrode and is laterally offset from neighboring ground electrode segments by gaps spanned by predetermined sections of said active layer; and
   said predetermined sections of said active layer are in intimate contact with said thick dielectric layer.

9. The varactor of claim 8 wherein
   said semiconductor layer is a thin film semiconductor.

10. The varactor of claim 9
    said semiconductor layer is doped to define said ground electrode segments.

11. The varactor of claim 9 wherein
    said ground electrode segments reside in a patterned layer which is longitudinally adjacent to said active layer.

12. The varactor of any of claims 8–11 wherein
    said semiconductor layer is thin film polysilicon.

13. The varactor of claim 8 wherein
    said gate electrode is composed of a plurality of laterally gapped segments, and
    said ground electrode segments are laterally staggered with respect to said gate electrode segments, such that there are two ground electrode segments in partial overlapping alignment with opposite sides of each of said gate electrode segments.

14. The varactor of claim 13 wherein
    said semiconductor layer is a thin film semiconductor.

15. The varactor of claim 14
    said semiconductor layer is doped to define said ground electrode segments.

16. The varactor of claim 14 wherein
    said ground electrode segments reside in a patterned layer which is longitudinally adjacent to said active layer.

17. The varactor of any of claims 13–16 wherein
    said semiconductor layer is thin film polysilicon.

* * * * *